(12) United States Patent
Tseng et al.

(10) Patent No.: US 10,440,841 B2
(45) Date of Patent: Oct. 8, 2019

(54) ELECTRONIC DEVICE

(71) Applicant: HTC Corporation, Taoyuan (TW)

(72) Inventors: Chun Tseng, Taoyuan (TW); Shih-Po Chien, Taoyuan (TW); Yi-Ting Liu, Taoyuan (TW); Yu-Jing Liao, Taoyuan (TW); I-Cheng Chuang, Taoyuan (TW); Chi-Jer Wang, Taoyuan (TW); Wen-Shian Lin, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/878,422

(22) Filed: Jan. 24, 2018

(65) Prior Publication Data
US 2019/0075663 A1    Mar. 7, 2019

Related U.S. Application Data

(60) Provisional application No. 62/553,140, filed on Sep. 1, 2017.

(51) Int. Cl.
*H05K 5/00* (2006.01)
*H05K 5/03* (2006.01)
*H04M 1/02* (2006.01)

(52) U.S. Cl.
CPC ........ *H05K 5/0017* (2013.01); *H04M 1/0202* (2013.01); *H05K 5/03* (2013.01); *H04M 1/0266* (2013.01)

(58) Field of Classification Search
CPC ...... G06F 3/041; G06F 1/1626; G06F 1/1643; G06F 1/1656; H04M 1/0268; H04M 2250/22
See application file for complete search history.

(56) References Cited

U.S. PATENT DOCUMENTS

| | | | |
|---|---|---|---|
| 8,669,948 B2 * | 3/2014 | Kim | H04M 1/0283 345/173 |
| 2011/0069027 A1 | 3/2011 | Kim et al. | |
| 2016/0334897 A1 * | 11/2016 | Nakamura | H04M 1/0268 |

OTHER PUBLICATIONS

"Alternative 3D Glass Technology", retrieved from "http://blog.sina.com.cn/s/blog_6ef244a40102wrx5.html".
"Office Action of Taiwan Counterpart Application", dated Apr. 11, 2019, p. 1-p. 7.

* cited by examiner

*Primary Examiner* — James Wu
*Assistant Examiner* — Hung Q Dang
(74) *Attorney, Agent, or Firm* — JCIPRNET

(57) ABSTRACT

An electronic device including a housing, a display component and an electronic component is provided. The housing includes a transparent cover and a middle frame, and the transparent cover is assembled to the middle frame. The display component is disposed in the housing. The electronic component is disposed in the housing, wherein the transparent cover has a flat portion and a connecting portion. The connecting portion curvingly extends from a side of the flat portion and includes at least one bonding surface, and a thickness of the flat portion is different from a thickness of the connecting portion.

16 Claims, 5 Drawing Sheets

ELECTRONIC DEVICE

CROSS-REFERENCE TO RELATED APPLICATION

This application claims the priority benefits of U.S. provisional application Ser. No. 62/553,140, filed on Sep. 1, 2017. The entirety of the above-mentioned patent application is hereby incorporated by reference herein and made a part of this specification.

BACKGROUND

Technical Field

The application relates to an electronic device, particularly related to a housing of the electronic device.

Description of Related Art

In general, a glass cover is set on a display module of an electronic device, such that an image beam provided by the display module reaches a projectile through the glass cover. However, in the currently used thermoforming process, edges of a common glass cover usually form a bigger radius of curvature, which leads to the electronic device having a bigger border. Therefore, how to design an electronic device having a narrow border has been the goal people skilled in the art dedicated to achieving.

SUMMARY

The application provides an electronic device, which a narrow border is reached and the space utilization rate is further increased.

The application provides an electronic device including a housing, a display component and an electronic component. The housing includes a transparent cover and a middle frame, and the transparent cover is assembled to the middle frame. The display component is disposed in the housing. The electronic component is disposed in the housing, wherein the transparent cover has a flat portion and a connecting portion. The connecting portion curvingly extends from a side of the flat portion and includes at least one bonding surface. Besides, a thickness of the flat portion is different from a thickness of the connecting portion.

The application also provides an electronic device including the housing, the display component and the electronic component. The housing includes a first transparent cover, a second transparent cover, and a middle frame. The first transparent cover has a first flat portion and a first connecting portion. The second transparent cover has a second flat portion and a second connecting portion. The first transparent cover and the second transparent cover are assembled to the middle frame respectively. The display component is disposed in the housing, and is located between the first transparent cover and the middle frame. The electronic component is disposed in the housing and is located between the second transparent cover and the middle frame, wherein the first connecting portion and the second connecting portion curvingly extends from the side of the first flat portion and the side of the second flat portion respectively and includes at least one first bonding surface and at least one second bonding surface respectively. A thickness of the first flat portion is different from a thickness of the first connecting portion, and a thickness of the second flat portion is different from a thickness of the second connecting portion.

Based on the above, in the electronic device of the application, since the different thickness of the flat portion and the connecting portion of the first transparent cover of the housing, the curvature of the first transparent cover is increased, the narrow border is further reached and the space utilization rate is further increased.

To make the aforementioned features and advantages of the invention more comprehensible, several embodiments accompanied with drawings are described in detail as follows.

DESCRIPTION OF THE EMBODIMENTS

Figure 1:
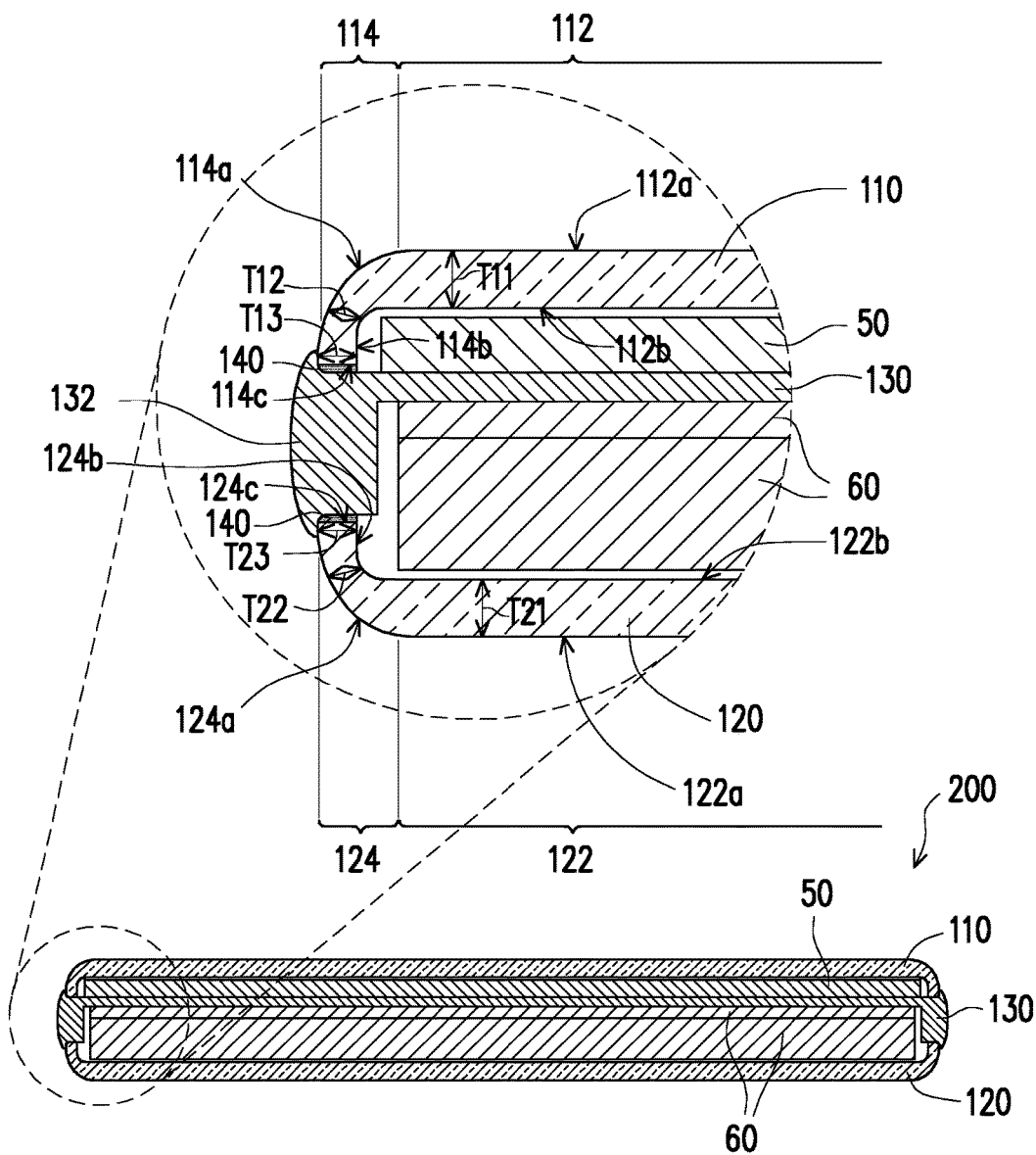
FIG. 1 is a schematic cross-sectional view of an electronic device of an embodiment of the invention.

FIG. 1 is a schematic cross-sectional view of an electronic device of an embodiment of the invention. Please refer to FIG. 1. In this embodiment, an electronic device 200 (i.e., a smart phone) includes a housing 100, a display component 50, and an electronic component 60. The housing 100 includes two transparent covers (including a first transparent cover 110 and a second transparent cover 120) and a middle frame 130. The display component 50 and the electronic component 60 are disposed in the housing 100. The display component 50 includes a display panel or a flexible display panel. The electronic component 60 includes a circuit board and a battery. Specifically, the display component 50 is located between the first transparent cover 110 and the middle frame 130, while the electronic component 60 is located between the second transparent cover 120 and the middle frame 130. In other words, the middle frame 130 is located between the display component 50 and the electronic component 60. In the embodiment, the first transparent cover 110 and the second transparent cover 120 are, for example, a glass cover, a quartz cover, a sapphire cover, a ceramic cover, or other non-polymer covers. However, the application is not limited thereto.

In this embodiment, the first transparent cover 110 and the second transparent cover 120 are assembled to the middle frame 130 respectively. Specifically, the first transparent cover 110 has a first flat portion 112 and a first connecting portion 114, and the first connecting portion 114 is located around the first flat portion 112. The second transparent cover 120 has a second flat portion 122 and a second connecting portion 124. Besides, the second connecting portion 124 is located around the second flat portion 122. Therefore, the first transparent cover 110 is assembled to the middle frame 130 by the first connecting portion 114, and the second transparent cover 120 is assembled to the middle frame 130 by the second connecting portion 124.

In the first transparent cover 110, the first connecting portion 114 curvingly extend from the side of the first flat portion 112. The first flat portion 112 includes a first flat outer surface 112a and a first flat inner surface 112b. The first connecting portion 114 includes a first outer surface 114a, a first inner surface 114b, and at least one first bonding surface 114c. The at least one first bonding surface 114c is coupled with the middle frame 130 by the adhesive layer 140, such as glue, double-sided tape, or the like, and an extension direction of the at least one first bonding surface 114c is parallel to an extension direction of the first flat portion 112. As such, the bonding area of the first transparent cover 110 and the middle frame 130 is reduced, and the space utilization rate is further increased.

Similarly, in the second transparent cover 120, the second connecting portion 124 curvingly extends from the side of the second flat portion 122. The second flat portion 122 includes a second flat outer surface 122a and a second flat inner surface 122b. The second connecting portion 124 includes a second outer surface 124a, a second inner surface 124b, and at least one second bonding surface 124c. The at least one second bonding surface 124c is coupled with the middle frame 130 by the adhesive layer 140, such as glue, double-sided tape, or the like, and an extension direction of the at least one second bonding surface 124c is parallel to an extension direction of the second flat portion 122. As such, the bonding area of the second transparent cover 120 and the middle frame 130 is reduced, and the space utilization rate is further increased similarly.

In addition, a thickness T11 of the first flat portion 112 is different from a thickness T12 of the first connecting portion 114, and a thickness T21 of the second flat portion 122 is different from a thickness T22 of the second connecting portion 124. For instance, in this embodiment, the thickness T11 of the first flat portion 112 is greater than the thickness T12 of the first connecting portion 114, and the thickness T21 of the second flat portion 122 is greater than the thickness T22 of the second connecting portion 124. However, the application is not limited thereto. As such, the thicknesses of the flat portions of the first transparent cover 110 and the second transparent cover 120 are different from the thicknesses of the connecting portions of the first transparent cover 110 and the second transparent cover 120 respectively to increase curvatures of the connecting portions, narrow borders are further reached, and the space utilization rate is further increased.

Besides, in this embodiment, a radius of curvature of the first outer surface 114a of the first transparent cover 110 is greater than a radius of curvature of the first inner surface 114b, and a radius of curvature of the second outer surface 124a of the second transparent cover 120 is greater than a radius of curvature of the second inner surface 124b. However, in other embodiments, a radius of curvature of the first outer surface 114a may also be smaller than a radius of curvature of the first inner surface 114b, and a radius of curvature of the second outer surface 124a may also be smaller than a radius of curvature of the second inner surface 124b. The application is not limited thereto. As such, apart from increasing the curvature of the connecting portions, the thickness changes of the connecting portions of the first transparent cover 110 and the second transparent cover 120 may be further adjusted.

In detail, a thickness of a part of the first connecting portion 114 adjacent to the first flat portion 112 (that is, the thickness T11 of the first flat portion 112) is different from a thickness T13 of a part of the first connecting portion 114 adjacent to the at least one first bonding surface 114c. Besides, a thickness of a part of the second flat portion 122 adjacent to the second connecting portion 124 (that is, the thickness T21 of the second flat portion 122) is different from a thickness T23 of a part of the second flat portion 122 adjacent to the at least one second bonding surface 124c. For instance, in this embodiment, the thickness T12 of the first connecting portion 114 gradually increases from a central part of the first connecting portion 114 to a part of the first connecting portion 114 adjacent to the first flat portion 112 and a part of the first connecting portion 114 adjacent to the at least one first bonding surface 114c, and the thickness T22 of the second connecting portion 124 gradually increases from a central part of the second connecting portion 124 to a part of the second connecting portion 124 adjacent to the second flat portion 112 and a part of the second connecting portion 124 adjacent to the at least one second bonding surface 124c. As such, curvatures of the first transparent cover 110 and the second transparent cover 120 are further increased. At the same time, by increasing the thickness T13 of the part adjacent to the at least one first bonding surface 114c and the thickness T23 of the part adjacent to the at least one second bonding surface 124c, the bonding area of the first transparent cover 110 and the middle frame 130 and the bonding area of the second transparent cover 120 and the middle frame 130 are increased to improve the bonding strength.

Furthermore, in the embodiment, in the first transparent cover 110, a thickness of a part of the first connecting portion 114 adjacent to the first flat portion 112 (that is, the thickness T11 of the first flat portion 112) is greater than the thickness T13 of a part of the first connecting portion 114 adjacent to the first bonding surface 114c. Besides, the thickness T13 of a part of the first connecting portion 114 adjacent to the first bonding surface 114c is greater than the thickness of the central part of the first connecting portion 114 (that is, the thickness T12 of the first connecting portion 114). A thickness of a part of the second connecting portion 124 of the second transparent cover 120 adjacent to the second flat portion 122 (that is, the thickness T21 of the second flat portion 122) is greater than the thickness T23 of a part of the second connecting portion 124 adjacent to at least one second bonding surface 124c. Besides, the thickness T23 of a part of the second connecting portion 124 adjacent to the at least one second bonding surface 124c is greater than the thickness of the central part of the second connecting portion 124 (that is, the thickness T22 of the second connecting portion 124). As such, the thicknesses of the first connecting portion 114 and the second connecting portion 124 may be further reduced to achieve the thinness design of an electronic device and the design of maximizing the display area.

On the other hand, in this embodiment, a middle frame 130 has a connecting portion 132, and the first transparent cover 110 and the second transparent cover 120 are fixed to opposite sides of the connecting portion 132 respectively. More specifically, in this embodiment, edges of the connecting portion 132 are matched with the corresponding first outer surface 114a of the first connecting portion 114 and the corresponding second outer surface 124a of the second connecting portion 124. As such, the bonding strength of the first transparent cover 110 and the middle frame 130 is increased and the bonding strength of the second transparent cover 120 and the middle frame 130 is increased.

Figure 2:
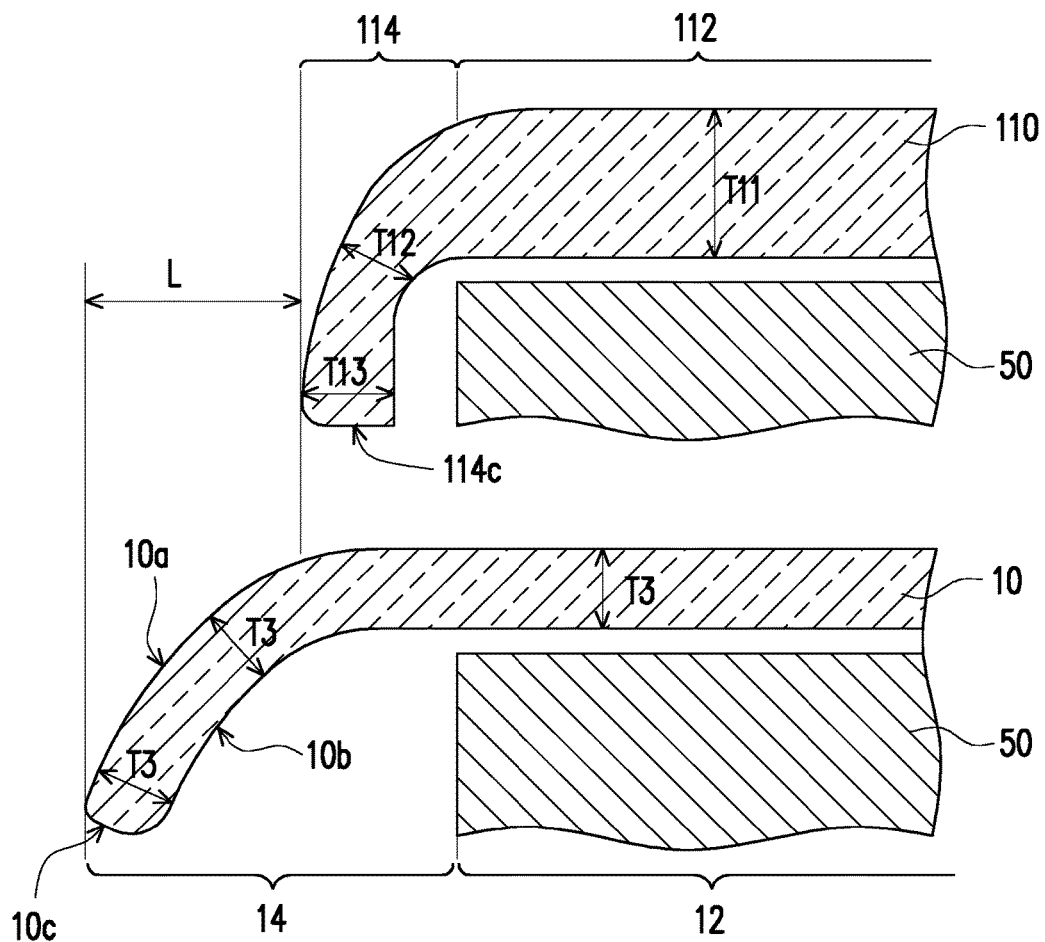
FIG. 2 is a schematic cross-sectional view of the electronic device of FIG. 1 and an electronic device of related arts for comparison.

FIG. 2 is a schematic cross-sectional view of the first transparent cover and the display component of FIG. 1 and a glass transparent cover and a display component of related arts for comparison. Please refer to FIG. 1 and FIG. 2. In a glass transparent cover 10 manufactured in a common thermoforming process, the thickness T3 of each area of the glass transparent cover 10 is the same, which leads to a connecting portion 14 surrounded by a flat portion 12 having a bigger curved surface (and an outer surface 10a) and a bigger radius of curvature. However, the display component 50 cannot contact with an inner surface 10b of the glass transparent cover 10. Therefore, to place the display component 50, in a common condition, the connecting portion 14 of the glass transparent 10 needs to be extended longer as illustrated in FIG. 2. Besides, since the connecting portion 14 of the glass transparent cover 10 has a greater radius of curvature, the side 10c of the glass transparent cover 10 fails to be used to be coupled with the middle frame 130 (see FIG. 1) for the angle limitation. Therefore, when coupling, the adhesive layer 140 (see FIG. 1) such as glue, double-sided tape, or the like is set on the inner surface 10b of the glass transparent cover 10 to couple with the middle frame.

However, in this embodiment, the first transparent cover 110 is combined by a plurality of vitreous and manufactured through computer numerical control process (CNC process). Therefore, the first transparent cover 110 acquires a smaller radius of curvature relative to the glass transparent cover 10, such that the first connecting portion 114 of the first transparent cover 110 reduces a length L for both sides when compared with the connecting portion 14 of the glass transparent cover 10. As such, the length of the first connecting portion 114 of the first transparent cover 110 is shortened, and a narrow border is further reached. In addition, the first transparent cover 110 manufactured through CNC process has the first bonding surface 114c on the same plane. As such, the middle frame 130 (see FIG. 1) coupled on the first transparent cover 110 is easily manufactured.

Figure 3:
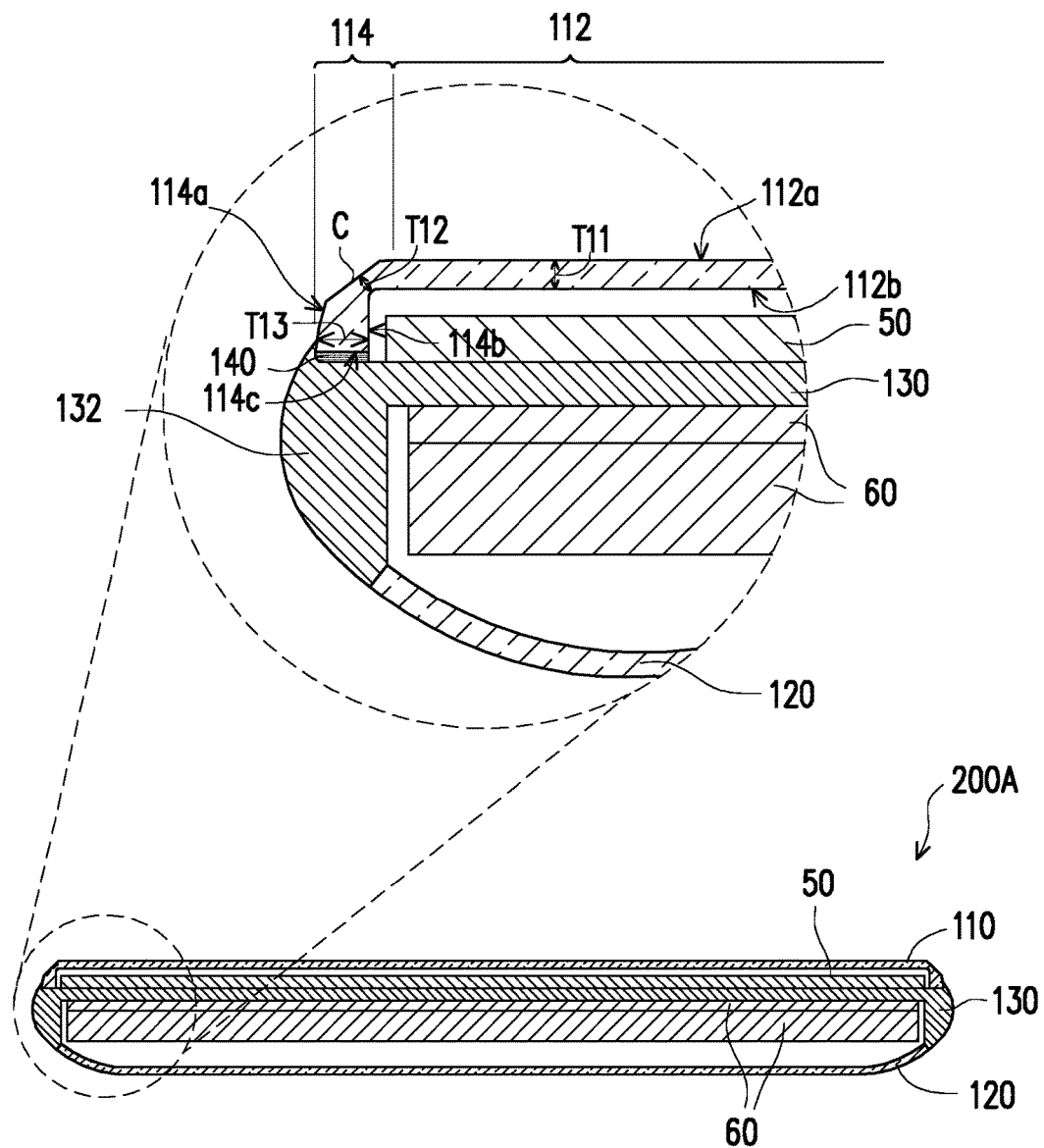
FIG. 3 is a schematic cross-sectional view of an electronic device of another embodiment of the invention.

FIG. 3 is a schematic cross-sectional view of an electronic device of another embodiment of the invention. Please refer to FIG. 3. An electronic device 200A of the embodiment is similar to the electronic device of FIG. 1, wherein the difference between the two is that, in this embodiment, a thickness T11 of the first flat portion 112 of the first transparent cover 110 is smaller than a thickness T12 of the first connecting portion 114. In addition, the second transparent cover 120 may be configured with a glass transparent cover manufactured by the thermoforming process, as illustrated in FIG. 2. Yet, in other embodiments, the second transparent cover 120 is chosen to be a transparent cover similar to the first transparent cover 110. However, the application is not limited thereto. In other words, in some embodiments, types of the first transparent cover 110 and the second transparent cover 120 of the electronic device 200A may be adjusted based on the actual situation or usage needs. However, the application is not limited thereto. As such, the electronic device 200A of the embodiment improves the structural strength of edges. Besides, in this embodiment, the first outer surface 114a of the first connecting portion 114 has a fillet structure C.

Specifically, in this embodiment, a thickness T12 of the first connecting portion 114 gradually increases from a central part of the first connecting portion 114 to a part of the first connecting portion 114 adjacent to the first flat portion 112 and a part of the first connecting portion 114 adjacent to the at least one first bonding surface 114c A thickness T13 of a part of the first connecting portion 114 adjacent to the at least one first bonding surface 114c is greater than a thickness T11 of a part of the first connecting portion 114 adjacent to the first flat portion 112, and a thickness T11 of a part of the first connecting portion 114 adjacent to the first flat portion 112 is greater than a thickness T11 of a central part of the first connecting portion 114 (that is, the thickness T12 of the first connecting portion 114). As such, in addition to further improving the curvature, the first transparent cover 110 increases the bonding area of the first transparent cover 110 and the middle frame 130 at the same time, and further improves the bonding strength. In addition, the thickness of the first flat portion 112 is further reduced to achieve the thinness design of an electronic device.

Figure 4A:
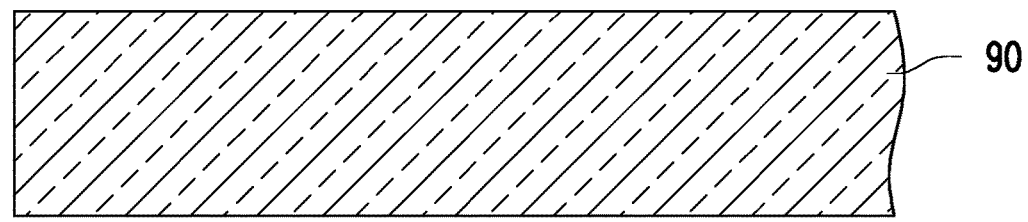
FIG. 4A to FIG. 4B are schematic cross-sectional views of a manufacturing process of a transparent cover of an embodiment of the invention in sequence.
Figure 4B:
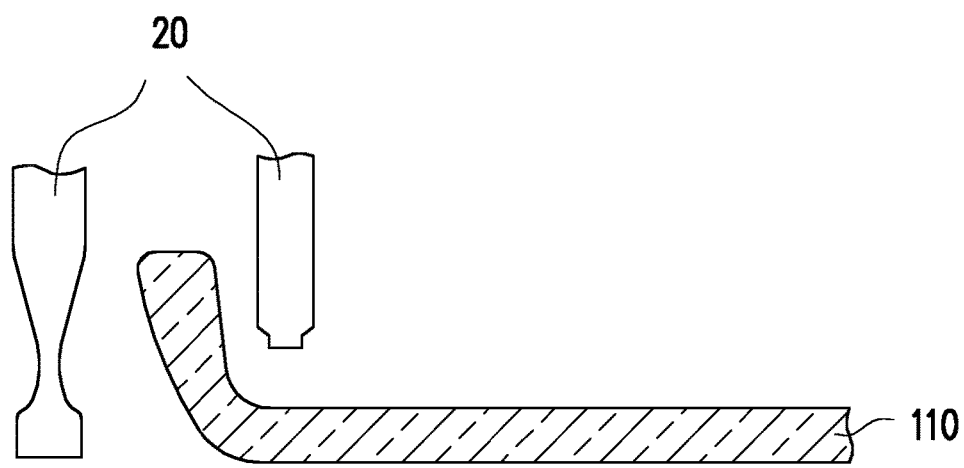

FIG. 4A to FIG. 4B are schematic cross-sectional views of a manufacturing process of a transparent cover of an embodiment of the invention in sequence. Please refer to FIG. 1, FIG. 4A and FIG. 4B at the same time. The transparent cover manufacturing process of the embodiment is applied to at least the first transparent cover 110 and the second transparent cover 120 of the aforementioned embodiment in FIG. 1, and the first transparent cover 110 of the aforementioned embodiment in FIG. 3. For the convenience of explanation, the embodiment takes the first transparent cover 110 of FIG. 1 as an example. In this embodiment, a transparent substrate 90 is provided first, as illustrated in FIG. 4A. In this embodiment, the transparent substrate 90 is a non-polymer and transparent material, such as glass, quartz, sapphire, or ceramics, etc. Then, the transparent substrate 90 undergoes a CNC process to form the first transparent cover 110, wherein the inner and outer surfaces of the first transparent cover 110 are processed by different cutting tools 20 as illustrated in FIG. 4B. However, the application is not limited thereto. As such, a transparent cover that is not uniform in thickness may be manufactured, and has a narrow border and greater curvatures at the edges.

Figure 5A:
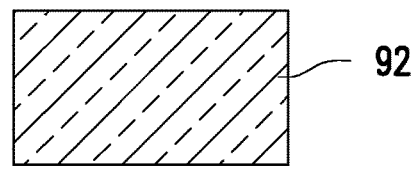
FIG. 5A to FIG. 5C are schematic cross-sectional views of a manufacturing process of a transparent cover of another embodiment of the invention in sequence.
Figure 5A:
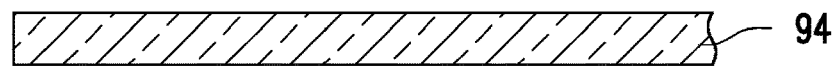
Figure 5B:
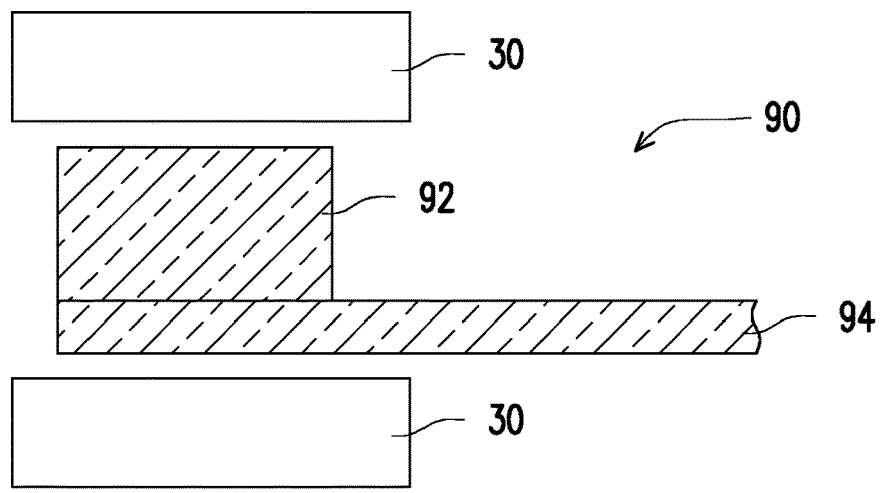
Figure 5C:
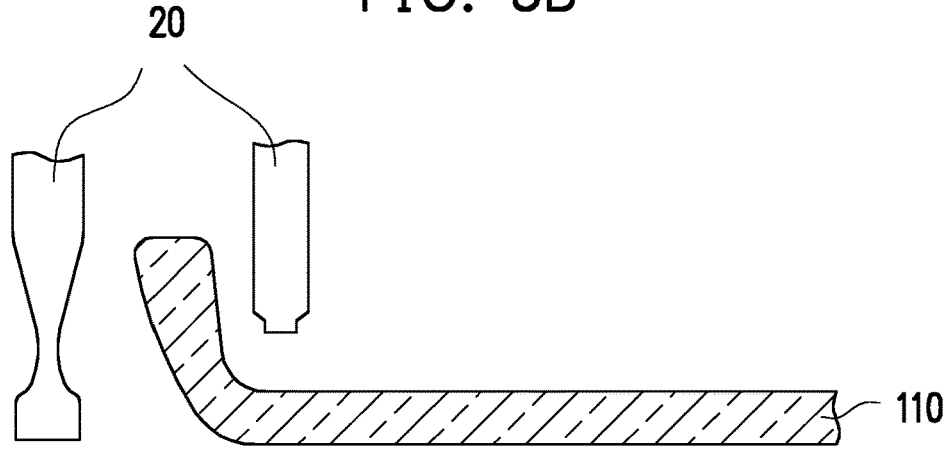

FIG. 5A to FIG. 5C are schematic cross-sectional views of a manufacturing process of a transparent cover of another embodiment of the invention in sequence. Please refer to FIG. 1 to FIG. 5A to FIG. 5C. The manufacturing process of the transparent cover is at least applied to the first transparent cover 110 of the aforementioned embodiment in FIG. 1, and the second transparent cover 120, and the first transparent cover 110 of the aforementioned embodiment in FIG. 3. For the convenience of explanation, the embodiment takes the first transparent cover 110 of FIG. 1 as an example. The manufacturing process of the transparent cover of the embodiment is similar to the manufacturing process of the transparent cover of FIG. 4A to FIG. 4B. The difference between the two is that, in this embodiment, a first transparent substrate 92 and a second transparent substrate 94 are provided first, as illustrated in FIG. 5A. Specifically, the first transparent substrate 92 is suitable for manufacturing the flat portion of the transparent cover and one part of the connecting portion, while the second transparent substrate 94 is suitable for manufacturing another part of the connecting portion. Then, the first transparent substrate 92 and the second transparent substrate 94 are thermally fused by a heating device 30 to form the transparent substrates 90, as illustrated in FIG. 5B. Then, the transparent substrate 90 undergoes a CNC process to form a first transparent cover 110, wherein the inner and outer surfaces of the first transparent cover 110 are manufactured by the different cutting tools 20 as illustrated in FIG. 5C. However, the application is not limited thereto. As such, a cover having a narrow border and greater curvatures at the edges may be manufactured.

Based on the foregoing, in the electronic device of the application, since the different thicknesses of the flat portion and the connecting portion of the first transparent cover of the housing, the curvature of the first transparent cover may be increased, and thus the narrow border is further reached and the space utilization rate may be increased.

Although the invention has been described with reference to the above embodiments, the invention is not limited to the above embodiments. It is apparent to one of ordinary skill in the art that modifications and variations to the described embodiments may be made without departing from the spirit and scope of the invention. Accordingly, the scope of the invention will be defined by the attached claims.

What is claimed is:

1. An electronic device, comprising:
   a housing, comprising:
   a transparent cover; and
   a middle frame, the transparent cover being assembled to the middle frame;
   a display component, disposed in the housing; and
   an electronic component, disposed in the housing, wherein the transparent cover has a flat portion and a connecting portion, the connecting portion curvingly extends from a side of the flat portion and comprises at least one bonding surface, and a thickness of the flat portion is different from a thickness of the connecting portion,
   wherein the middle frame protrudes out from an exterior surface of the transparent cover along a direction parallel to an extending direction of the flat portion,
   wherein the connecting portion further comprises an outer surface and an inner surface, and a radius of curvature of the outer surface is greater than or smaller than a radius of curvature of the inner surface, and
   wherein a thickness of the connecting portion gradually increases from a central part of the connecting portion to a part of the connecting portion adjacent to the flat portion and a part of the connecting portion adjacent to the at least one bonding surface.

2. The electronic device according to claim 1, wherein an extension direction of the at least one bonding surface is parallel to an extension direction of the flat portion.

3. The electronic device according to claim 1, wherein a thickness of a part of the connecting portion adjacent to the flat portion is different from a thickness of a part of the connecting portion adjacent to the at least one bonding surface.

4. The electronic device according to claim 1, wherein the at least one bonding surface extends in a same plane.

5. The electronic device according to claim 1, wherein the middle frame has a bonding portion, and the transparent cover is fixed to the bonding portion.

6. The electronic device according to claim 5, wherein an edge of the bonding portion is matched with the corresponding outer surface of the connecting portion.

7. The electronic device according to claim 1, wherein the outer surface of the connecting portion has a chamfer face.

8. The electronic device according to claim 1, wherein the display component is located between the transparent cover and the middle frame.

9. The electronic device according to claim 1, wherein the middle frame is located between the transparent cover and the display component.

10. An electronic device, comprising:
    a housing, comprising:
    a first transparent cover, having a first flat portion and a first connecting portion;
    a second transparent cover, having a second flat portion and a second connecting portion; and
    a middle frame, the first transparent cover and the second transparent cover being assembled to the middle frame respectively;
    a display component, disposed in the housing and is located between the first transparent cover and the middle frame; and
    an electronic component, disposed in the housing and is located between the second transparent cover and the middle frame, wherein the first connecting portion and the second connecting portion curvingly extend from sides of the first flat portion and the second flat portion respectively and comprise at least one first bonding surface and at least one second bonding surface respectively, a thickness of the first flat portion is different from a thickness of the first connecting portion, and a thickness of the second flat portion is different from a thickness of the second connecting portion,
    wherein the middle frame protrudes out from an exterior surface of one of the first transparent cover and the second transparent cover along a direction parallel to an extending direction of corresponding one of the first flat portion and the second flat portion,
    wherein the first connecting portion further comprises a first outer surface and a first inner surface, the second connecting portion further comprises a second outer surface and a second inner surface, and the first inner surface and the second inner surface are located between the first outer surface and the middle frame and the second outer surface and the middle frame respectively, a radius of curvature of the first outer surface is greater than or smaller than a radius of curvature of the first inner surface, and a radius of curvature of the second outer surface is greater than or smaller than a radius of curvature of the second inner surface, and
    wherein a thickness of a part of the first connecting portion gradually increases from a central part of the first connecting portion to a part of the first connecting portion adjacent to the first flat portion and a part of the first connecting portion adjacent to the at least one first bonding surface and a thickness of the second connecting portion gradually increases from a central part of the second connecting portion to a part of the second connecting portion adjacent to the second flat portion and a part of the second connecting portion adjacent to the at least one second bonding surface.

11. The electronic device according to claim 10, wherein extension directions of the at least one first bonding surface and the second bonding surface are parallel to extension directions of the first flat portion and the second flat portion respectively.

12. The electronic device according to claim 10, wherein a thickness of a part of the first connecting portion adjacent to the first flat portion is different from a thickness of a part of the first connecting portion adjacent to the at least one first bonding surface, and a thickness of a part of the second connecting portion adjacent to the second flat portion is different from a thickness of a part of the second connecting portion adjacent to the at least one second bonding surface.

13. The electronic device according to claim 10, wherein the at least one first bonding surface extends in a same plane, and the at least one second bonding surface extends in another same plane.

14. The electronic device according to claim 10, wherein the middle frame has a connecting portion, and the first transparent cover and the second transparent cover are fixed to opposite sides of the connecting portion respectively.

15. The electronic device according to claim 14, wherein edges of the connecting portion of the middle frame are matched with the first outer surface of the first connecting portion and the second outer surface of the second connecting portion.

16. The electronic device according to claim 10, wherein the first outer surface of the first connecting portion and the second outer surface of the second connecting portion have chamfer faces.

* * * * *